United States Patent
Chin et al.

(10) Patent No.: US 6,586,312 B1
(45) Date of Patent: Jul. 1, 2003

(54) METHOD FOR FABRICATING A DRAM CAPACITOR AND DEVICE MADE

(75) Inventors: Pin Hsiang Chin, Hsin-Chu (TW); Fouriers Tseng, Hsin-Chu (TW)

(73) Assignee: Taiwan Semiconductor Manufactoring Co., Ltd., Hsin Chu (TW)

( * ) Notice: Subject to any disclaimer, the term of this patent is extended or adjusted under 35 U.S.C. 154(b) by 597 days.

(21) Appl. No.: 09/056,985

(22) Filed: Apr. 8, 1998

(51) Int. Cl.7 ................................................ H01L 21/20
(52) U.S. Cl. ........................ 438/396; 438/255; 438/398
(58) Field of Search ................................. 438/253, 254, 438/255, 396, 397, 398

(56) References Cited

U.S. PATENT DOCUMENTS

| | | | | |
|---|---|---|---|---|
| 5,656,536 A | * | 8/1997 | Wu | 438/397 |
| 5,770,499 A | * | 6/1998 | Kwok et al. | 438/253 |
| 5,851,898 A | * | 12/1998 | Hsia et al. | 438/396 |
| 5,869,367 A | * | 2/1999 | Fazan et al. | 438/253 |
| 5,891,772 A | * | 4/1999 | Hsu | 438/254 |

* cited by examiner

Primary Examiner—Tuan H. Nguyen
(74) Attorney, Agent, or Firm—Tung & Associates

(57) ABSTRACT

The present invention discloses a method for forming a DRAM capacitor that has improved charge storage capacity by first alternatingly depositing layers of BPTEOS oxide and PETEOS oxide onto a semiconductor substrate and then forming a contact hole through the insulating layers utilizing a wet etchant that has high selectivity for the PETEOS oxide layers such that a zig-zag surface is formed in the contact hole and subsequently a capacitor that has improved charge storage capacity. The present invention novel method can be used to form any type of stacked capacitors, for instance, a stacked capacitor, a fin-type stacked capacitor, a crown-type stacked capacitor, etc.

12 Claims, 4 Drawing Sheets

METHOD FOR FABRICATING A DRAM CAPACITOR AND DEVICE MADE

FIELD OF THE INVENTION

The present invention generally relates to a method for forming a DRAM capacitor that has improved charge storage capacity and device made by such method and more particularly, relates to a method for forming a DRAM capacitor that has improved charge storage capacity by forming a zig-zag sidewall in the capacitor cell and device made by such method.

BACKGROUND OF THE INVENTION

In the design of VLSI and ULSI memory devices, a structure of DRAM is frequently used for its simplicity in fabrication and its high unit capacitance when designed in a stacked structure. The DRAM memory cells have been named dynamic because they can retain information only for a limited time and then they must be read and refreshed periodically. The operation of a DRAM cell is therefore in contrast to a static random access memory cell which does not require periodic refresh signals in order to retain stored data. In a typical DRAM cell, the structure includes a transistor and a storage capacitor. When DRAM cells were first developed, planar type storage capacitors which occupy large wafer surface areas have been used. As the circuit density increases in modern semiconductor devices where smaller chips are being made and being packed with ever-increasing number of circuits, i.e., devices fabricated by the ULSI technology, the specific capacitance of a storage capacitor must be increased in order to meet such demands.

Researchers in the technology of semiconductor processing have tried different approaches in efforts to achieve higher capacitance on limited usage of chip real estate. For instance, one of such approach is to store charges vertically in a capacitor which is built on top of transistor and thus allowing a smaller cell to be built without losing storage capacity. Other researchers have proposed the use of a fin-type capacitor structure to further improve the storage capacity of the DRAM capacitor. A DRAM capacitor is typically formed by at least two layers of semi-conducting materials and one layer of a dielectric material. For instance, a typical DRAM capacitor utilizes a thin oxide layer sandwiched between two polysilicon layers for producing a high capacitance capacitor cell. In the stacked structure, the capacitor can be built by stacking over the bit line on the surface of a silicon substrate. The effective capacitance of a stacked cell is increased over that of a conventional planar cell due to its increased surface area.

The stacked capacitors which include the fin-type stacked capacitors have been successfully used in 16 MB DRAM devices. However, as device density increases to 256 MB or higher, the planar surface required for building a conventional stacked capacitor becomes excessive and thus cannot be tolerated. Other techniques are thus needed to further improve the unit capacitance of a DRAM stacked capacitor cell.

It is therefore an object of the present invention to provide a method for fabricating a DRAM capacitor in a stacked structure that does not have the drawbacks or shortcomings of the conventional DRAM stacked capacitors.

It is another object of the present invention to provide a method for fabricating a DRAM capacitor that has improved storage capability without increasing the chip real estate usage.

It is a further object of the present invention to provide a method for fabricating a DRAM capacitor that has improved charge storage capacity by increasing the surface area available in the contact hole for forming the capacitor.

It is another further object of the present invention to provide a method for fabricating a DRAM capacitor that has improved charge storage capacity by forming a zig-zag sidewall structure in a contact hole for forming the capacitor.

It is still another object of the present invention to provide a method for fabricating a DRAM capacitor that has improved charge storage capacity by forming a contact hole in multiple layers of insulating materials of BPTEOS oxide and PETEOS oxide such that a zig-zag contact hole can be formed.

It is yet another object of the present invention to provide a method for forming a DRAM capacitor that has improved charge storage capacity by wet etching a contact hole formed in alternating layers of BPTEOS oxide and PETEOS oxide materials with an etchant that has sufficiently high etch selectivity toward PETEOS oxide in order to form a corrugated sidewall in the contact hole.

It is still another further object of the present invention to provide a method for fabricating a DRAM capacitor that has improved charge storage capacity by adding a layer of undoped silicate glass between a BPTEOS oxide layer and a PETEOS oxide layer such that shorting between a Poly 2 layer and a Poly 3 layer is eliminated.

It is yet another further object of the present invention to provide a method for fabricating a DRAM capacitor that has improved charge storage capacity by first performing an anisotropic etching process for forming a straight contact hole and then a wet etching process for forming a zig-zag sidewall in the contact hole.

SUMMARY OF THE INVENTION

In accordance with the present invention, a method for forming a DRAM capacitor that has improved charge storage capacity is provided in which a zig-zag sidewall of a capacitor cell is formed such that the surface area of the capacitor cell is increased and thereby increasing its charge storage capacity.

In a preferred embodiment, a method for forming a DRAM capacitor that has improved charge storage capacity can be carried out by the operating steps of first providing a preprocessed semiconductor structure which has a gate structure formed on top, then alternatingly depositing first a BPTEOS oxide layer and then a PETEOS oxide layer on top of the structure such that at least one BPTEOS oxide layer and at least one PETEOS oxide layer are formed on top of the structure, then anisotropically etching a contact hole substantially vertical sidewalls exposing the edges of the PETEOS oxide and the BPTEOS oxide layers, then wet etching the semiconductor structure with an etchant which has a sufficiently high etch selectivity toward the PETEOS oxide layers such that a substantially uneven sidewall is formed in the contact hole, and then depositing and forming subsequent conductive and dielectric layers forming the DRAM capacitor.

In another preferred embodiment, a method for improving the charge storage capacity of a DRAM capacitor can be carried out by the steps of first providing a pre-processed semiconductor structure that has a gate structure formed on top, then depositing a first layer of BPTEOS oxide on top of the gate structure, then depositing a first layer of PETEOS oxide on top of the first BPTEOS oxide layer, then depositing a second layer of BPTEOS oxide on top of the first layer of PETEOS oxide, then depositing a second layer of PETEOS oxide on the second layer of BPTEOS oxide, then anisotropically etching a contact hole of substantially vertical sidewalls to expose the edges. of PETEOS oxide and BPTEOS oxide layers, then wet etching the semiconductor structure with an etchant that has a sufficiently high etch selectivity toward the PETEOS layers such that a zig-zag sidewall is formed in the contact hole, and depositing and forming subsequent polysilicon and dielectric layers to form the DRAM capacitor.

In still another preferred embodiment, a method for forming a DRAM capacitor that has increased charge storage capacity can be carried out by the operating steps of first providing a pre-processed semiconductor wafer, then depositing a first BPTEOS oxide layer on the wafer, then depositing a buffer layer on the first BPTEOS oxide layer, the buffer layer protects a previously formed electrode from being shorted by a subsequently deposited electrode layer when the BPTEOS oxide layer is subjected to a wet etch process, then depositing a first PETEOS oxide layer on the buffer layer, then repeating the deposition process for the BPTEOS oxide layer and the PETEOS oxide layer until at least two BPTEOS oxide layers and at least two PETEOS oxide layers are deposited on top of the wafer, then anisotropically etching a contact hole of substantially vertical sidewalls to expose the edges of the PETEOS oxide layers and the BPTEOS oxide layers, then wet etching the semiconductor wafer with an etchant which has a sufficiently high etch selectivity toward the PETEOS oxide layers such that a substantially uneven sidewall is formed in the contact hole, and then depositing and forming subsequent polysilicon and dielectric layers forming the DRAM capacitor.

BRIEF DESCRIPTION OF THE DRAWINGS

Other objects, features and advantages of the present invention will be come apparent upon consideration of the specification and the appended drawings, in which.

DESCRIPTION OF THE PREFERRED AND ALTERNATE EMBODIMENTS

Figure 1A:
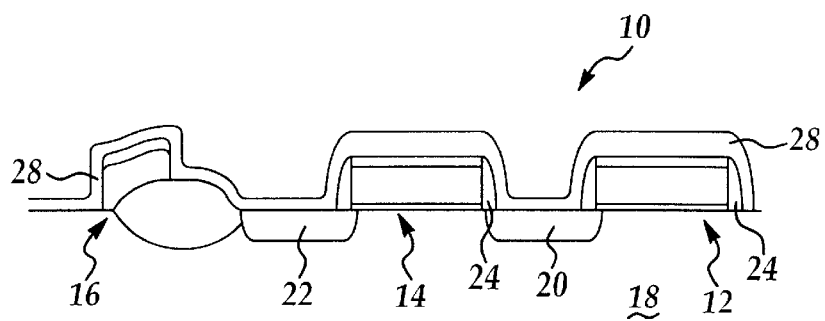
FIG. 1A is an enlarged, cross-sectional view of a present invention semiconductor structure that is pre-processed with a gate structure formed on top.

The present invention discloses a method for fabricating a DRAM capacitor that has improved charge storage capacity by wet etching a contact hole that is formed by multiple layers of BPTEOS oxide and PETEOS oxide with an etchant that has high selectivity toward the PETEOS oxide such that a zig-zag surface in the contact hole is formed to increase its surface area to improve its charge storage capacity.

Referring initially to FIG. 1, wherein a present invention semiconductor structure 10 is shown. In semiconductor structure 10, polysilicon gate structures 12, 14 and 16 are formed on a silicon substrate 18. Ion implanted node contact 20 is provided for a bit line contact, and ion implanted node contact 22 is provided for a stacked capacitor. The polysilicon gate structures 12, 14 and 16 including sidewall spacers 24 are first formed by conventional methods and then covered with an insulating layer 28 by a material such as undoped silicate glass (USG). A suitable thickness for the USG layer is between about 500 Å and about 1,500 Å. A typical thickness to be used is approximately 1,000 Å which can be deposited by a chemical vapor deposition method.

Figure 1B:
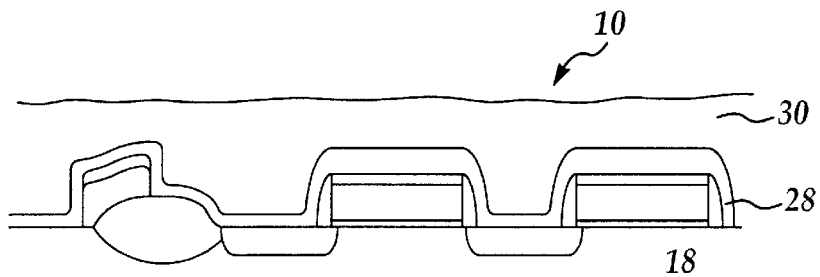
FIG. 1B is an enlarged, cross-sectional view of the present invention semiconductor structure of FIG. 1A having a BPTEOS oxide layer deposited on top.

In the next step of the process, as shown in FIG. 1B, a BPTEOS oxide layer 30 having a thickness between about 2,000 Å and about 4,000 Å is deposited. A typical thickness used is about 3,000 Å. The BPTEOS (borophosphor TEOS) oxide can be deposited by a chemical vapor deposition process and then planarized by a reflow process at a temperature of 700~850° C. The two insulating layers deposited 28, are commonly known in the semiconductor fabrication industry as an IPO-1 (inter-poly-oxide) layer.

Figure 1C:
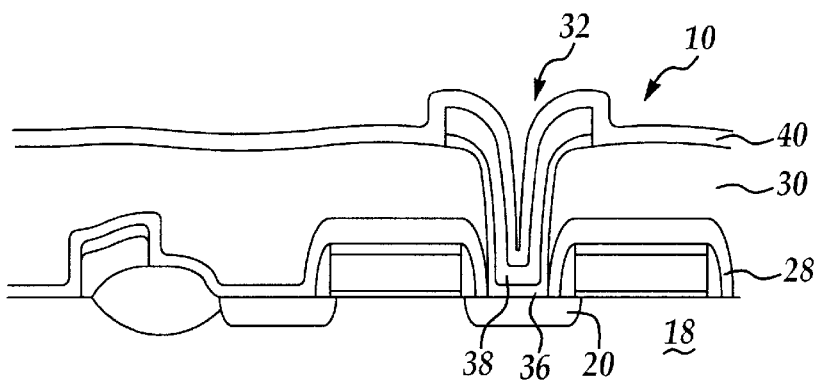
FIG. 1C is an enlarged, cross-sectional view of the present invention semiconductor structure of FIG. 1B having a bit line contact formed and a PETEOS oxide layer deposited on top.

In the following process step, as shown in FIG. 1C, a bit line contact 32 is formed for contacting the node contact 20 by the sequential deposition of first a tungsten silicide layer 36 and then a doped polysilicon layer 38. The tungsten silicide layer 36 is deposited to a thickness of about 1,250 Å for reducing the resistivity of the contact. The polysilicon layer 38 is deposited to a thickness of approximately 550 Å and doped with ion impurities to improve its conductivity. On top of the bit line contact 32, a layer of PETEOS oxide is blanket deposited to cover the bit line contact 32 and the BPTEOS oxide layer 30 previously deposited on the remaining structure of the substrate 10. The PETEOS oxide is deposited in a non-doped form by a plasma enhanced chemical vapor deposition technique. The thickness range for the PETEOS oxide layer 40 is between about 500 Å and about 1,500 Å. A typical thickness is approximately 1,000 Å.

Figure 1D:
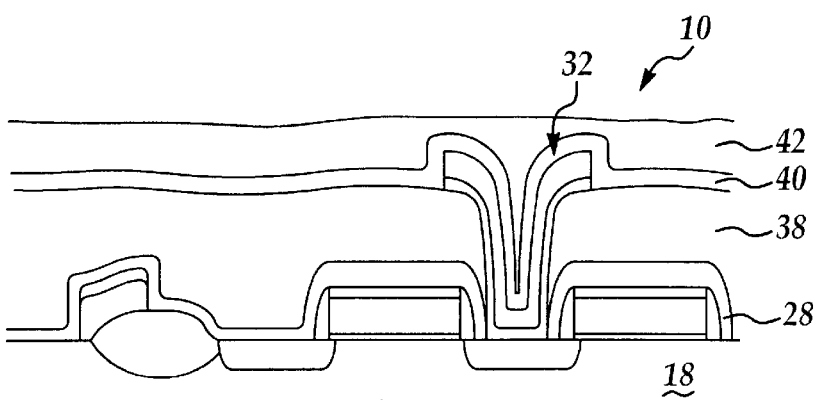
FIG. 1D is an enlarged, cross-sectional view of the present invention semiconductor structure of FIG. 1C having a second BPTEOS oxide layer deposited on top.
Figure 1E:
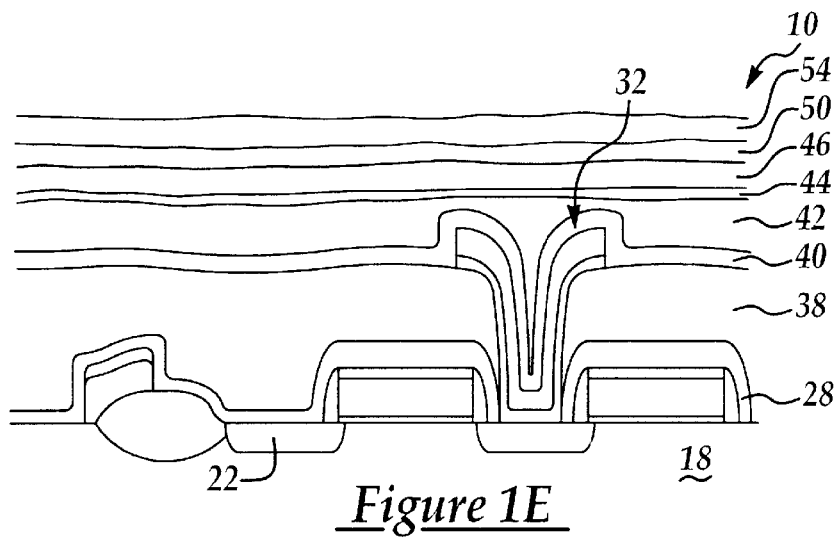
FIG. 1E is an enlarged, cross-sectional view of the present invention semiconductor structure of FIG. 1D having a second PETEOS oxide layer deposited on top.

On top of the PETEOS oxide layer 40, a second BPTEOS oxide layer 42 is then deposited to a thickness of between about 1,500 Å and about 2,500 Å. A typical thickness for the second BPTEOS oxide layer 42 is approximately 2,000 Å. No etch back process is required for the second BPTEOS oxide layer 42. This is shown in FIG. 1D. A silicon nitride etch-stop layer 44 is then blanket deposited on top of the planarized BPTEOS oxide layer 42. The thickness of the silicon nitride layer is approximately 200 Å. On top of the silicon nitride layer 44, a second PETEOS layer 46 of 800 Å thickness, a poly layer 50 of 550 Å thickness and a third PETEOS layer 54 of 800 Å thickness are then sequentially deposited.

Figure 1F:
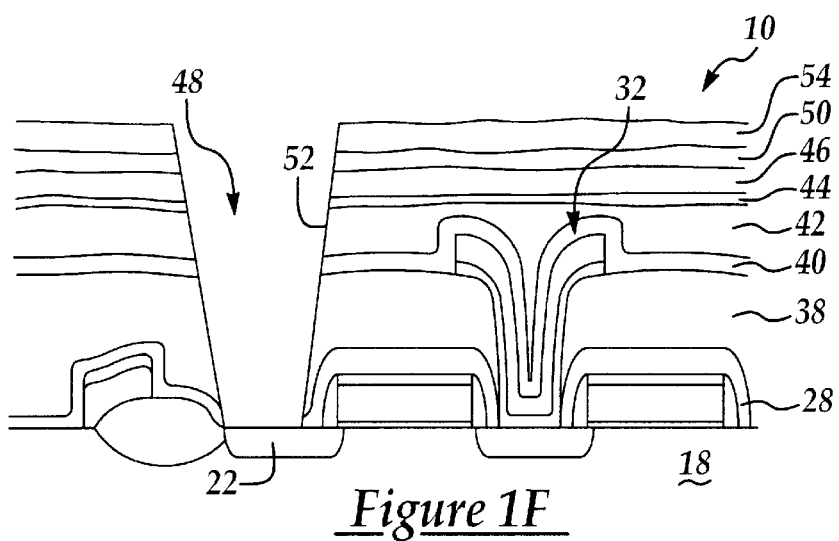
FIG. 1F is an enlarged, cross-sectional view of the present invention semiconductor structure of FIG. 1E having a contact hole formed by an anisotropic etching method.

The structure 10 is then subjected to an anisotropic etching process for opening a substantially straight contact hole 48. The anisotropic etching process can be advantageously carried out by a reactive ion etching method by utilizing a suitable etching gas mixture. For instance, a suitable gas mixture of $CHF_3$ (trifluoromethane) and $CF_4$ (carbon tetrafluoride) can be used at a chamber pressure of about 250 m Torr. The etching gas chemistry should be selected such that there is no selectivity between the PETEOS oxide layers 40, 46, 54 and the BPTEOS oxide layers 38 and 42. As a result, a substantially straight sidewall 52 is formed after the reactive ion etching process. The anisotropic etching process exposes the node contact 22 such that a capacitor can be later built on the node contact. This is shown in FIG. 1F.

Figure 1G:
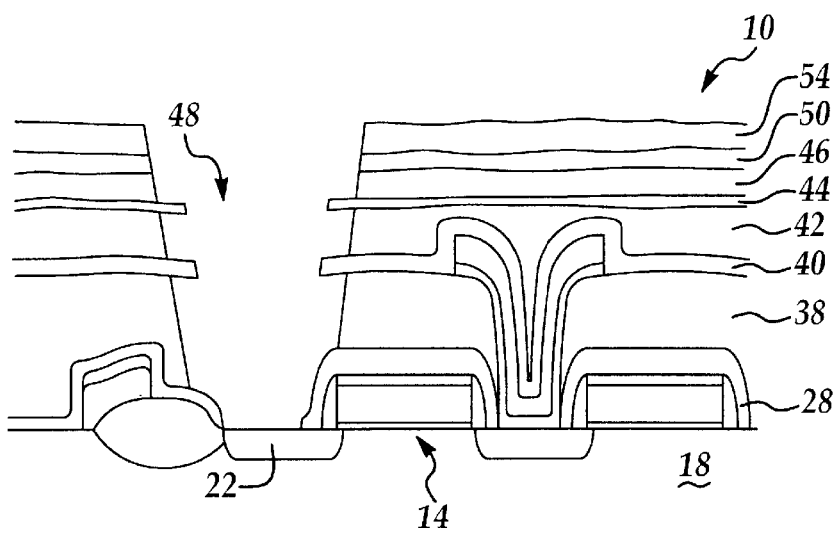
FIG. 1G is an enlarged, cross-sectional view of the present invention semiconductor structure of FIG. 1F having a layer of the BPTEOS oxide layers etched away in a wet etching process.

In the next step of the process, the novel present invention method of creating a stacked capacitor that has improved charge storage capacity can be achieved. As shown in FIG. 1G, the semiconductor structure 10 is subjected to a wet dip method with a suitable etchant solution which has a high selectivity toward the PETEOS oxide layers 40, 46 and 54. As a result, a new surface 56 on the BPTEOS oxide layers 38 and 42 are formed by exposing to the etchant solution while the PETEOS oxide layers 40, 46 and 54 are not affected and keep its original surface 52 in the contact hole 48. The polysilicon gate structure 14 is protected by the insulating layer 28 formed of undoped silicate glass which is not sensitive to the etchant solution.

When a suitable etchant solution is selected, for instance, of an ammonia-containing solution such as $NH_4OH$, the BPTEOS oxide layers 38 and 42 can be rapidly etched away-while the PETEOS oxide layers 40, 46 and 54 are hardly affected. For instance, a 400 Å thickness of BPTEOS oxide can be etched away in 3 minutes when exposed to a $NH_4OH$ solution. Other tests have been conducted in such etchant for as long as 20 minutes without etching away all the BPTEOS oxide layer. As a result, a new sidewall 56 of the BPTEOS oxide layers 38 and 42 are formed, while the sidewall 52 of the PETEOS oxide layers 40, 46 and 54 protects the dimension of the opening of the C2 contact hole 48. This is another unexpected result achieved by the present invention novel method in that it is very important to avoid increasing the opening dimension of contact hole 48 which would worsen the Poly3/Contact 2 overlay margin. The uneven, or zig-zag surface 56 formed on the BPTEOS oxide layers 38 and 42 therefore provides additional surface area in the capacitor and thus improving its charge storage capacity. The present invention novel method therefore enables the capacitance of a DRAM capacitor to be increased while maintaining the contact opening size and using the same chip real estate.

Figure 1H:
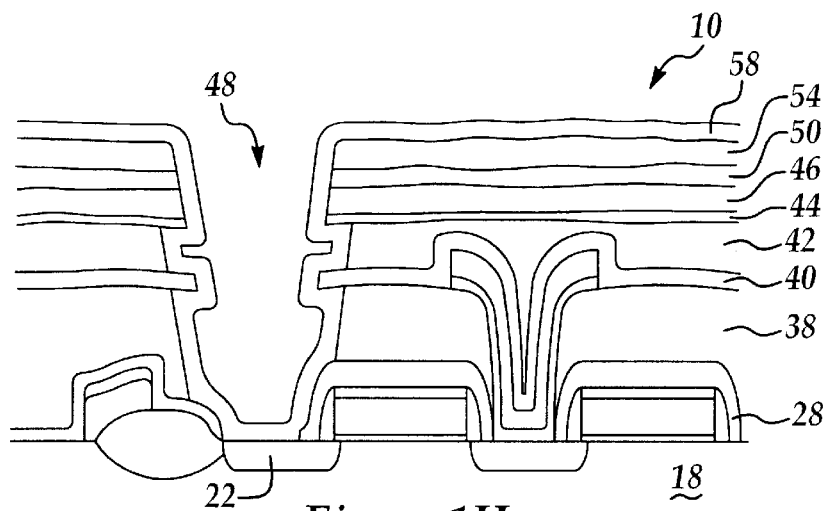
FIG. 1H is an enlarged, cross-sectional view of the present invention semiconductor structure of FIG. 1G having a bottom electrode material deposited therein.
Figure 1I:
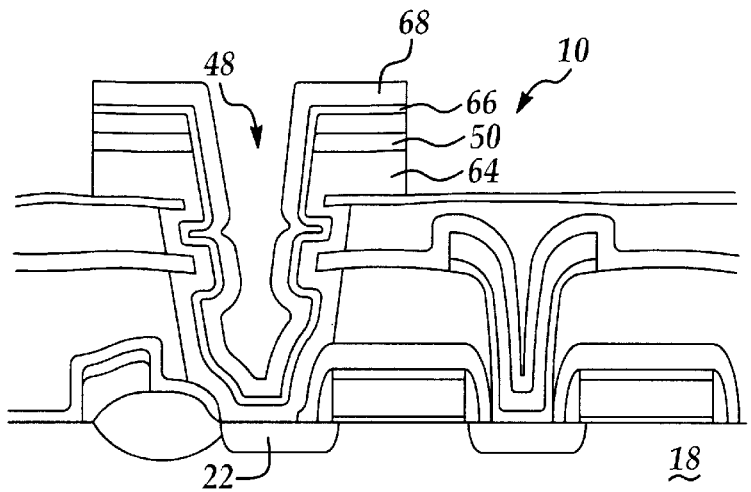
FIG. 1I is an enlarged, cross-sectional view of the present invention semiconductor structure of FIG. 1H having a dielectric layer and an upper electrode layer deposited and formed.

In the final steps of the process, as shown in FIGS. 1H and 1I, a polysilicon layer 58 is first deposited into contact hole 48 to form a bottom electrode 64, a dielectric layer 66 is then deposited of a material such as an oxide-nitride-oxide (ONO) composite to form the capacitor dielectric. A final polysilicon layer 68 is then deposited and formed as the upper electrode or the cell plate. This completes the fabrication process for the stacked DRAM capacitor.

Figure 2:
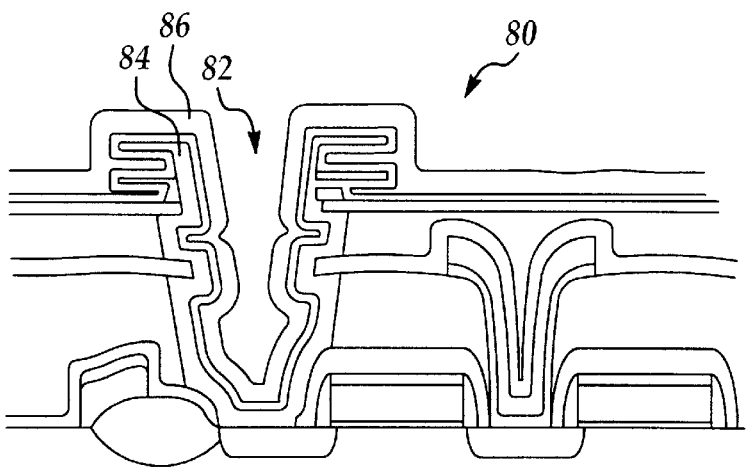
FIG. 2 is an enlarged, cross-sectional view of an alternate embodiment of the present invention wherein a fin-type capacitor structure is formed.

In an alternate embodiment of the present invention, a semiconductor structure 80 is shown wherein a contact hole 82 is formed by a method similar to that used in the present invention preferred embodiment described above. After the formation of the zig-zag sidewall, a fin-type capacitor structure having a bottom electrode 84 and a top electrode 86 is formed. The method of forming such fin-type stacked capacitor structure has been described in literature and is therefore not provided in detail here. The fin-type capacitor structure further improves the charge storage capacity of the stacked capacitor. This is shown in FIG. 2.

Figure 3A:
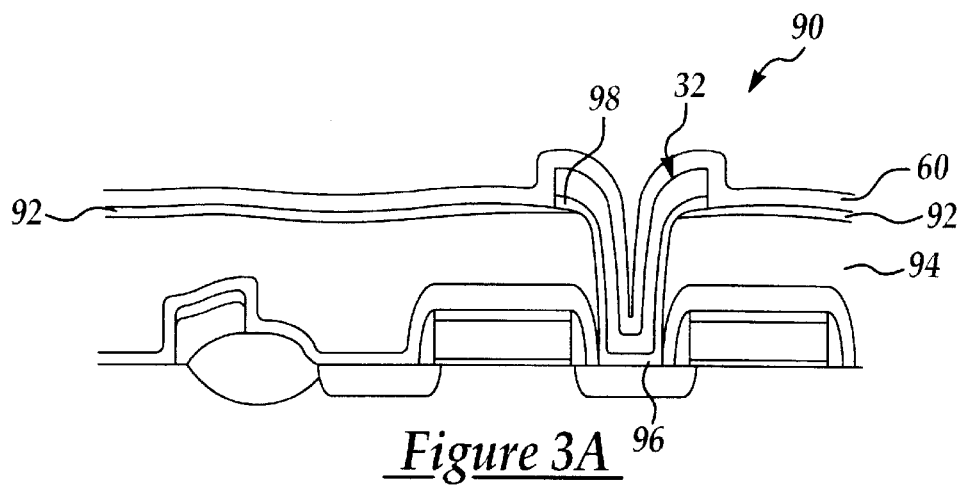
FIG. 3A is an enlarged, cross-sectional view of a second alternate embodiment of the present invention incorporating an additional layer of undoped silicate glass.
Figure 3B:
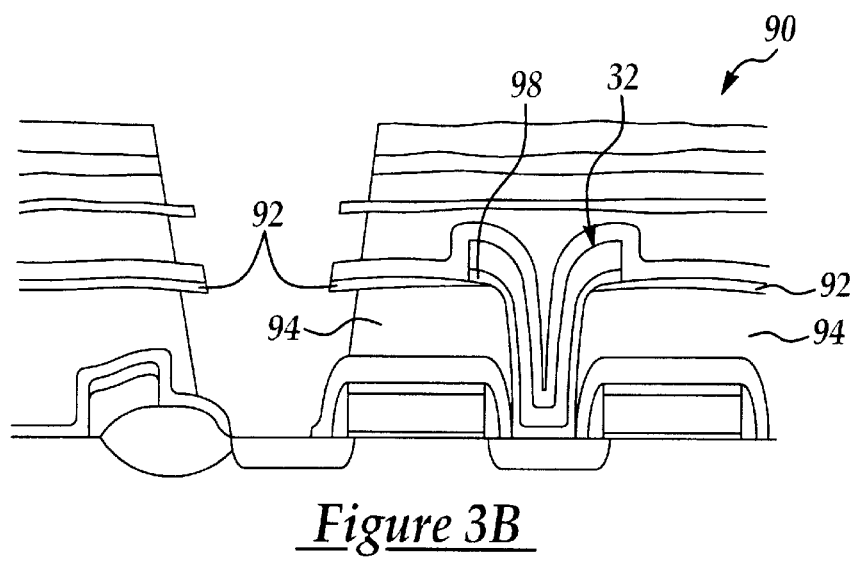
FIG. 3B is an enlarged, cross-sectional view of the second alternate embodiment of FIG. 3A having a zig-zag contact hole formed therein.
Figure 3C:
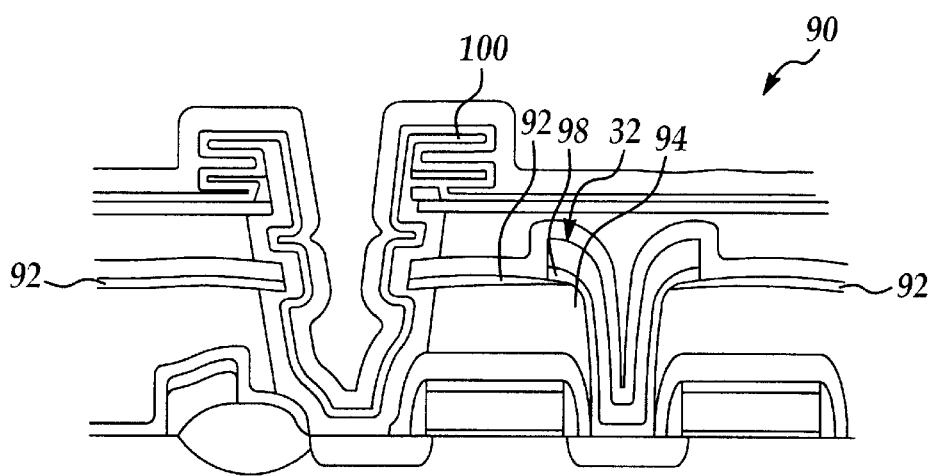
FIG. 3C is an enlarged, cross-sectional view of the second alternate embodiment of FIG. 3B having the electrode layers and the dielectric layer deposited and formed into a DRAM capacitor.

In a second alternate embodiment, as shown in FIGS. 3A–3C, a stacked capacitor similar to that shown in the preferred embodiment is provided. The only difference is that an additional insulating layer formed of undoped silicate glass (USG) 92 is deposited between the first BPTEOS oxide layer 94 and the first PETEOS oxide layer 96. The additional USG layer 92 provides the unexpected benefit that the Poly 2 layer 96 is protected and shielded by the USG layer. This is important since in a wet etching process where BPTEOS oxide layer 94 is etched away, the Poly 3/Contact 2 overlay margin must be accurately controlled. For instance, when the BPTEOS oxide layer 94 is over etched, the corner 98 of the bottom polysilicon electrode 96 for the bit line contact 32 may be shorted by a subsequently deposited polysilicon layer 100 during forming of the bottom electrode for the capacitor. The presence of the insulating USG layer 92 therefore ensures that a short between the Poly 2 layer 96 and the Poly 3 layer 100 does not occur. This provides an additional unexpected benefit which is made possible by the present invention novel method in that the Poly 3/Contact 2 process window can be improved, i.e., the time period for stopping the wet etch process is no longer critical since the P2 layer is protected by the USG layer 92.

The present invention novel method for fabricating a DRAM capacitor that has improved charge storage capacity has therefore been amply demonstrated by the above preferred embodiment and the two alternate embodiments. It should be noted that while the ammonia-containing etchant has been shown as a desirable etchant, the present invention novel process can be carried out by any other etchant as long as a desirable etch selectivity exists between the BPTEOS oxide layer and the PETEOS oxide layer. Furthermore, since the, present invention novel method increases the surface area in a contact hole, any DRAM capacitor structure such as a regular stacked DRAM capacitor, a fin-type stacked DRAM capacitor, or a crown-type stacked DRAM capacitor can utilize the present invention method in achieving the same advantageous result.

While the present invention has been described in an illustrative manner, it should be understood that the terminology used is intended to be in a nature of words of description rather than of limitation.

Furthermore, while the present invention has been described in terms of a preferred and two alternate embodiments, it is to be appreciated that those skilled in the art will readily apply these teachings to other possible variations of the inventions.

The embodiment of the invention in which an exclusive property or privilege is claimed are defined as follows:

1. A method for improving the charge storage capacity of a DRAM capacitor comprising the steps of:

providing a pre-processed semi-conducting structure having a gate structure formed on top, depositing a first layer of a BPTEOS oxide material on top of said gate structure, depositing a first layer of a PETEOS oxide material on top of said layer of BPTEOS oxide material, depositing a second layer of a BPTEOS oxide material on top of said first layer of PETEOS oxide material, depositing a second layer of PETEOS oxide material on said second layer of BPTEOS oxide, anisotropically etching by a reactive ion etching method a contact hole having substantially vertical sidewalls exposing edges of said PETEOS oxide and BPTEOS oxide layers, wet etching said semi-conducting structure with an etchant which has a sufficiently high etch selectivity toward said PETEOS oxide layers such that a zig-zag sidewall is formed in said contact hole, and depositing and forming subsequent polysilicon and dielectric layers forming said DRAM capacitor.

2. A method according to claim 1, wherein said anisotropic etching process is carried out by a reactive ion etching (RIE) technique.

3. A method according to claim 1, wherein said etchant used in said wet etching step is an ammonia-containing etchant.

4. A method according to claim 1, wherein said etchant used in said wet etching step is $NH_4OH$.

5. A method according to claim 1 further comprising the step of forming an undoped silicate glass (USG) layer between said first BPTEOS oxide layer and said first PETEOS oxide layer.

6. A method according to claim 5, wherein said USG layer is used as a buffer layer to improve Poly 3/Contact 2 process margin.

7. A method for forming a DRAM capacitor having increased charge storage capacity comprising the steps of:

providing a pre-processed semiconductor wafer, depositing a first BPTEOS oxide layer on said wafer, depositing a buffer layer on said first BPTEOS oxide layer, said buffer layer substantially protects a previously formed electrode from being shorted by a subsequently deposited electrode layer when said BPTEOS oxide layer is subjected to a wet etch process, depositing a first PETEOS oxide layer on said buffer layer, repeating said deposition process for said BPTEOS oxide layer and said PETEOS oxide layer such that at least two BPTEOS oxide layers and at least two PETEOS oxide layers are deposited on at top of said wafer, anisotropically etching by a gas mixture of $CHF_3$ and $CF_4$ a contact hole having substantially vertical sidewalls exposing edges of said PETEOS oxide and BPTEOS oxide layers, wet etching said semiconductor wafer with an ammonia-containing solution such that a zig-zag sidewall is formed in said contact hole, and depositing and forming subsequent polysilicon and dielectric layers forming said DRAM capacitor.

8. A method according to claim 7, wherein two layers of BPTEOS oxide and two layers of PETEOS oxide are deposited on said wafer in a sequence of a first BPTEOS oxide layer, a first PETEOS oxide layer, a second BPTEOS oxide layer and a second PETEOS oxide layer with said first BPTEOS oxide layer contacting said structure.

9. A method according to claim 7, wherein said BPTEOS oxide and said PETEOS oxide layers are deposited by a chemical vapor deposition process.

10. A method according to claim 7, wherein said anisotropic etching process is carried out by a reactive ion etching (RIE) technique.

11. A method according to claim 7, wherein said etchant used in said wet etching step is an ammonia-containing etchant.

12. A method according to claim 7, wherein said buffer layer deposited is an undoped silicate glass (USG) layer.

* * * * *